United States Patent
Kim et al.

(10) Patent No.: US 9,608,147 B2
(45) Date of Patent: Mar. 28, 2017

(54) PHOTOCONDUCTOR AND IMAGE SENSOR USING THE SAME

(71) Applicant: Samsung Electronics Co., Ltd., Suwon-si (KR)

(72) Inventors: Tae Gon Kim, Hwaseong-si (KR); Jinyoung Hwang, Incheon-si (KR); Eun Joo Jang, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 14/666,057

(22) Filed: Mar. 23, 2015

(65) Prior Publication Data

US 2016/0049536 A1  Feb. 18, 2016

(30) Foreign Application Priority Data

Aug. 13, 2014  (KR) .................. 10-2014-0105230

(51) Int. Cl.
*H01L 31/109* (2006.01)
*H01L 27/146* (2006.01)
*H01L 31/0352* (2006.01)

(52) U.S. Cl.
CPC ........ *H01L 31/035218* (2013.01); *H01L 27/14665* (2013.01); *H01L 31/109* (2013.01)

(58) Field of Classification Search
None
See application file for complete search history.

(56) References Cited

U.S. PATENT DOCUMENTS

| | | | |
|---|---|---|---|
| 5,767,535 A * | 6/1998 | Bachem | B82Y 20/00 257/94 |
| 7,742,322 B2 | 6/2010 | Sargent et al. | |
| 7,923,801 B2 | 4/2011 | Tian et al. | |
| 8,013,412 B2 | 9/2011 | Tian | |
| 8,203,195 B2 | 6/2012 | Ivanov et al. | |
| 8,482,093 B2 | 7/2013 | Tian et al. | |
| 8,610,232 B2 | 12/2013 | Coe-Sullivan et al. | |
| 8,643,058 B2 | 2/2014 | Bawendi et al. | |
| 2012/0129294 A1* | 5/2012 | Sartorius | H01L 31/03042 438/93 |

OTHER PUBLICATIONS

Gerasimos Konstantatos, et al., "Engineering the Temporal Response of Photoconductive Photodetectors via Selective Introduction of Surface Trap States," Nano Letters, vol. 8, No. 5, pp. 1446-1450, 2008.

(Continued)

*Primary Examiner* — Alexander Ghyka
(74) *Attorney, Agent, or Firm* — Cantor Colburn LLP

(57) ABSTRACT

A photoconductor includes a first semiconductor layer, a second semiconductor layer disposed on the first semiconductor layer, a first electrode connected to a first lateral side of the first semiconductor layer and the second semiconductor layer, and a second electrode connected to a second lateral side of the first semiconductor layer and the second semiconductor layer, where the first semiconductor layer and the second semiconductor layer form a type II junction or a quasi-type-II junction.

21 Claims, 14 Drawing Sheets

(56) References Cited

OTHER PUBLICATIONS

Gerasimos Konstantatos, et al., "Ultrasensitive solution-cast quantum dot photodetectors," vol. 44213, pp. 180-183, Jul. 13, 2006.
Jacek Jasieniak, et al., "Size-Dependent Valence and Conduction Band-Edge Energies of Semiconductor Nanocrystals", ACSNANO, vol. 5, No. 7, pp. 5888-5902, 2011.
Patrick R. Brown, et al., "Energy Level Modification in Lead Sulfide Quantum Dot Thin Films through Ligand Exchange", ACSNANO, vol. 8, No. 6, pp. 5863-5872, 2014.
Shiyou Chen, et al., "Thermodynamic Oxidation and Reduction Potentials of Photocatalytic Semiconductors in Aqueous Solution", Chemistry of Materials, vol. 24, pp. 3659-3666, 2012.

* cited by examiner

PHOTOCONDUCTOR AND IMAGE SENSOR USING THE SAME

CROSS-REFERENCE TO RELATED APPLICATIONS

This application claims priority to Korean Patent Application No. 10-2014-0105230 filed on Aug. 13, 2014, and all the benefits accruing therefrom under 35 U.S.C. §119, the content of which in its entirety is herein incorporated by reference.

BACKGROUND

1. Field

The disclosure relates to a photoconductor and an image sensor including the photoconductor.

2. Description of the Related Art

A silicon-based complementary metal-oxide semiconductor ("CMOS")/charge coupled device ("CCD") image sensor technique has been mainstream in the related art for the past 20 years. By an optimized design and process, the CMOS/CCD image sensor technique has stably provided a pixel having a size of about 1 micrometer (µm), which is a diffraction limit of visible rays, and has high reliability as a technique for simultaneous integration with a logic device related to image processing. Particularly, the CMOS image sensor consumes a low amount of power, and may effectively be applied to almost all cameras of mobile devices. Each pixel of the CMOS image sensor includes a photodiode for absorbing light and converting the absorbed light to an electrical signal, and a logic device for processing the electrical signal. Recently, the photoelectric conversion device (e.g., a photodiode) has been downsized to about 1 µm, such that an amount of absorbed light is too decreased to enhance the image quality even if the pixel becomes smaller.

As alternatives of silicon conventionally used in a photodiode, an organic semiconductor and a quantum dot ("QD") having higher light absorption by about 5-10 times that of silicon has recently drawn attention as a light absorber. In such an organic semiconductor and a QD, more light may be absorbed in a small area by having a high light adsorption rate. In addition, the organic semiconductor may provide a stacked structure because the organic semiconductor may selectively absorb light according to wavelength, thereby substantially improving the integration of an image sensor, and a colloid quantum dot has sensitivity that is comparable to the conventional monocrystal silicon with a thinner thickness by ten times that of silicon without an epitaxy process and has high compatibility with the silicon logic device.

The photo-detective structure using the colloid quantum dot operates in two ways, using a photodiode or a photoconductor. The photodiode has merits of a fast reaction speed and a low dark current even though the photodiode may not provide excited electron/hole pairs at greater than or equal to the number of absorbed photons. The photoconductor has drawbacks of a slow reaction speed and a high dark current, but the photoconductor may provide electron/hole pairs at more than several to ten times the number of the absorbed photons.

SUMMARY

The silicon photodiode has high reliability and high compatibility with a logic device, but the silicon itself has light absorption that is too low to further improve the image quality since the optical/electric interference (e.g., cross talk) in a pixel having a size of about 1 µm is increased. Particularly, the light absorption of the silicon photodiode may be substantially sharply decreased in the infrared ("IR") band, such that of the silicon photodiode may be difficult to be applied to an IR ray sensor for highly sensitive night filming, a 3-dimensional camera, a movement sensor, an iris recognition sensor, a health monitoring sensor, a thermal image sensor, and the like.

Alternatively, a quantum dot ("QD") image having various desirable characteristics, for example, high light absorption, a wide light absorption band including far-IR ray/mid-IR ray (about 5 µm), and relatively high electron mobility relative to the organic material, may be used as a light absorber for a photosensor. However, particularly, a photoconductor-type QD photodetector having persistent photoconductivity ("PPC") characteristics may not provide a fast response due to a residual current even after removing light in spite of high sensitivity characteristics.

According to an exemplary embodiment, a photoconductor includes a first semiconductor layer, a second semiconductor layer disposed on the first semiconductor layer, a first electrode connected to a first lateral side of the first semiconductor layer and the second semiconductor layer, and a second electrode connected to a second lateral side of the first semiconductor layer and the second semiconductor layer, where the first semiconductor layer and the second semiconductor layer form a type II junction or a quasi-type-II junction.

In an exemplary embodiment, the first semiconductor layer and the second semiconductor layer may each have a thickness in a range of about 5 nanometers (nm) to about 500 nm.

In an exemplary embodiment, the energy difference between the conduction band of the first semiconductor layer and the conduction band of the second semiconductor layer may be greater than or equal to about 0.1 electron volt (eV), and the energy difference between the valence band of the first semiconductor layer and the valence band of the second semiconductor layer may be greater than or equal to about 0.1 eV.

In an exemplary embodiment, each of the first semiconductor layer and the second semiconductor layer may include a quantum dot material, and the quantum dot material may include a nanocrystal including at least one selected from Group IV, II-VI, III-V, III2-VI3, I-III-VI2 and I2-II-IV-VI4 semiconductors.

In an exemplary embodiment, the quantum dot material may further include a ligand coated on the surface of the nanocrystal, the ligand may include at least one selected from a thiol-based ligand an amine-based, a halide-based ligand, a metal chalcogenide ligand a metal free inorganic ligand. In such an embodiment, the nanocrystal may have a size in a range of about 1 nm to about 50 nm.

In an exemplary embodiment, the photoconductor may further include a third electrode disposed under the first semiconductor layer or on the second semiconductor layer. In such an embodiment, the third electrode may be an electrode of gate structure coated on the insulation layer.

In an exemplary embodiment, the first semiconductor layer and the second semiconductor layer may provide a quasi-type-II junction. In such an embodiment, the energy difference between the conduction band of the first semiconductor layer and the conduction band of the second semiconductor layer may be less than about 0.1 eV, and the energy difference between the valence band of the first semiconductor layer and the valence band of the second semiconductor layer may be greater than or equal to about 0.1 eV.

In an exemplary embodiment, a voltage applied to the third electrode may change based on a quantity of light incident into the first semiconductor layer and the second semiconductor layer. In such an embodiment, the voltage applied to the third electrode may be in a range from about −40 volts (V) to about 40 V, or in a range from about −5 V to about 5 V.

In an exemplary embodiment, the photoconductor may further include a third semiconductor layer disposed on the second semiconductor layer, and a fourth semiconductor layer disposed on the third semiconductor layer, where the first electrode may be connected to a first lateral side of the third semiconductor layer and the fourth semiconductor layer, and the second electrode may be connected to a second lateral side of the third semiconductor layer and the fourth semiconductor layer.

In an exemplary embodiment, the third semiconductor layer and the fourth semiconductor layer may provide a type II junction or a quasi-type-II junction.

In an exemplary embodiment, each of the first semiconductor layer, the second semiconductor layer, the third semiconductor layer and the fourth semiconductor layer may include a quantum dot material, and the quantum dot material may include a nanocrystal including at least one selected from Group IV, II-VI, III-V, III2-VI3, I-III-VI2 and I2-II-IV-VI4 semiconductors.

In an exemplary embodiment, the quantum dot material may include a ligand coated on the surface of the nanocrystal, the ligand may include at least one selected from a thiol-based ligand, an amine-based ligand, a halide-based ligand, a metal chacogenide ligand and a metal free inorganic ligand including $S^{2-}$, $HS^-$, $Se^{2-}$, $Te^{2-}$, $HTe^-$, $TeS_3^{2-}$, $OH^-$, and $NH^{2-}$. In such an embodiment, the nanocrystal may have a size in a range of about 1 nm to about 50 nm.

DETAILED DESCRIPTION

Figure 1:
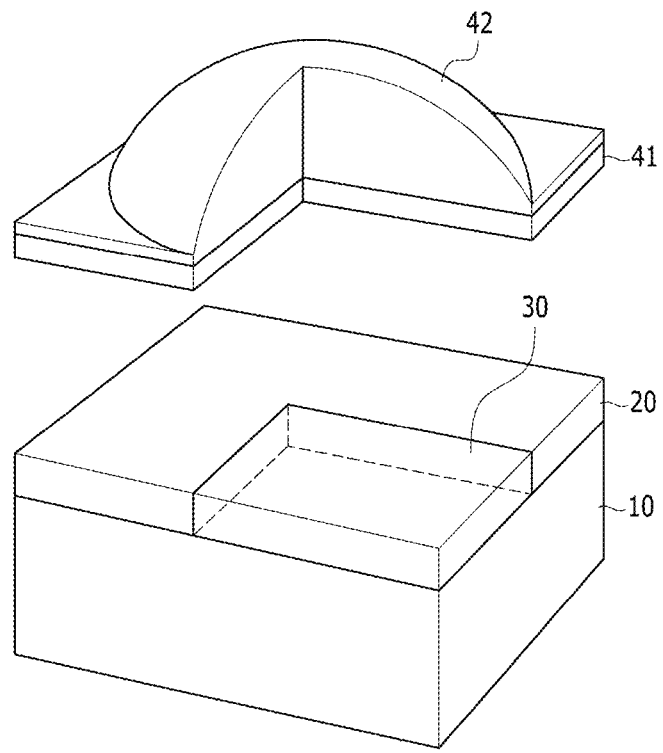
FIG. 1 is a cross-sectional view showing an exemplary embodiment of an image sensor.

The embodiments now will be described more fully hereinafter with reference to the accompanying drawings, in which various embodiments are shown. This embodiments may, however, be embodied in many different forms, and should not be construed as limited to the embodiments set forth herein. Rather, these embodiments are provided so that this disclosure will be thorough and complete, and will fully convey the scope to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Figure 2:
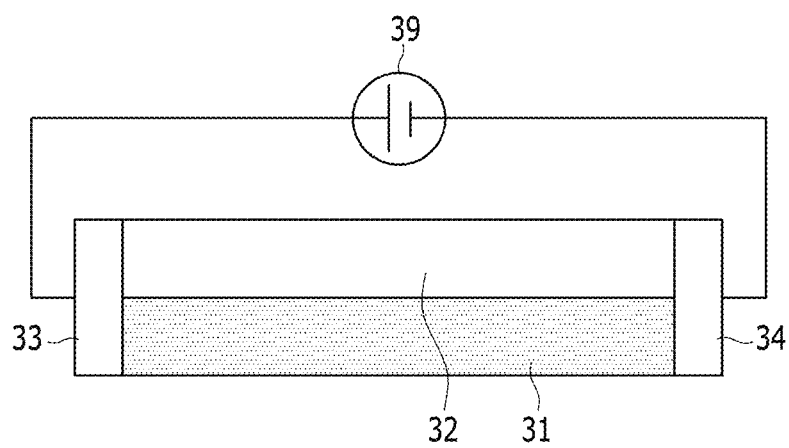
FIG. 2 is a cross-sectional view showing an exemplary embodiment of a photoconductor.
Figure 3:
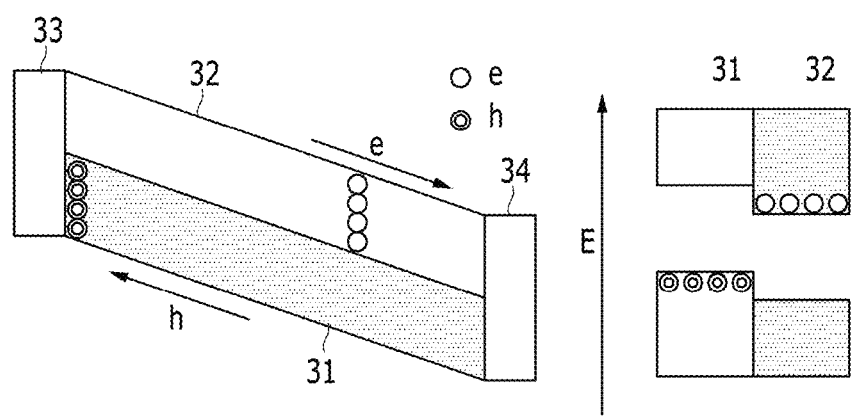
FIG. 3 is a schematic view showing an operation principle of the photoconductor shown in FIG. 2.

FIG. 1 is a cross-sectional view of an exemplary embodiment of an image sensor, FIG. 2 is a cross-sectional view of an exemplary embodiment of a photoconductor, and FIG. 3 is a schematic view showing the operation principle of the photoconductor shown in FIG. 2.

Referring to FIG. 1, an exemplary embodiment of the image sensor includes a substrate 10, a photoconductor 30 disposed on the substrate 10, an electronic circuit part 20 which controls the photoconductor 30 and processes a sensed electrical signal, a color filter 41 disposed on the photoconductor 30 and the electronic circuit part 20, and a micro lens layer 42 disposed on the color filter 41.

The substrate 10 may be a semiconductor substrate such as silicon, and may define a part of the electronic circuit for controlling the photoconductor 30 and processing the sensed electrical signal. The electronic circuit part 20 performs the elemental processes such as extracting the photoelectric-converted electrical signal and amplifying the extracted electrical signal by applying a voltage to a photoconductor 30. The electronic circuit part 20 may be separately provided and disposed on the substrate 10 or may be integrally formed with the substrate 10 as a part of the substrate 10. The color filter 41 filters only light having a predetermined color among white light to allow the filtered light to be transmitted to the photoconductor 30. The color filter 41 may include a plurality of color filters including red, green and blue color filters or a part thereof. The color filter 41 may be disposed corresponding to the photoconductor 30. The micro lens layer 42 increases a quantity (e.g., amount or intensity) of light incident into the photoconductors 30 or may be disposed corresponding to the photoconductor 30. The photoconductor 30 may include a photoelectric conversion device and discharge a current corresponding to the quantity of light incident into the photoconductors 30, that is, a current changing depending upon the quantity of light incident into the photoconductors 30.

Referring to FIG. 2, an exemplary embodiment of the photoconductor 30 will be described in greater detail.

In an exemplary embodiment, a photoconductor includes a first semiconductor layer 31, a second semiconductor layer 32 disposed on the first semiconductor layer 31 and in contact with the first semiconductor layer 31 to define a type II junction, and further includes a first electrode 33 and a second electrode 34 disposed to be in contact with (or connected to) both opposing lateral sides (e.g., first and second lateral sides) of the first semiconductor layer 31 and the second semiconductor layer 32, respectively, and electrically connected to the first semiconductor layer 31 and the second semiconductor layer 32. A direct-current ("DC") power source 39 may be connected between the first electrode 33 and the second electrode 34, and the first semiconductor layer 31 and the second semiconductor layer 32 may have conductivity to allow a current to flow therethrough when the first semiconductor layer 31 and the second semiconductor layer 32 receive light. The first semiconductor layer 31 and the second semiconductor layer 32 may defined a stacking structure. The stacking structure may be formed by stacking a quantum dot material, and include a pair of semiconductors capable of forming a type II junction. The semiconductors may include at least one selected from a Group IV, II-VI, III-V, III2-VI3, I-III-VI2 and I2-II-IV-VI4 semiconductors, or a combination/mixture thereof. The Group IV, II-VI, III-V, III2-VI3, I-III-VI2 or I2-II-IV-VI4 semiconductor may include Si, Ge, CdS, CdSe, CdTe, PbS, PbSe, PbTe, HgS, HgSe, HgTe, ZnS, ZnSe, ZnTe, InP, InAs, InSb, GaP, GaAs, GaSb, $In_2S_3$, $In_2Se_3$, $In_2Te_3$, $Ga_2S_3$, $Ga_2Se_3$, $Ga_2Te_3$, $Bi_2S_3$, $Bi_2Se_3$, $Bi_2Te_3$, $CuInS_2$, $CuGaS_2$, $CuInSe_2$, $CuGaSe_2$, $Cu_2ZnSnS_4$, $Cu_2ZnSnSe_4$ or a combination thereof. The quantum dot material may include a ligand coated on a surface of a nanocrystal. The quantum dot material may be formed by coating the surface of the nanocrystal including the semiconductor described above with the ligand. The ligand may include: a thiol-based ligand including benzenethiol ("BT"), 1,2-benzenedithiol ("1,2-BDT"), 1,3-benzenedithiol ("1,3-BDT"), 1,4-benzenedithiol ("1,4-BDT"), 1,2-ethanedithiol ("EDT") or 3-mercaptopropionic acid ("MPA"); an amine-based ligand including 1,2-ethylenediamine ("EDA") or ammonium thiocyanate ("SCN"); or a halide-based ligand including iodine, bromine, chlorine or fluorine such as tetrabutylammonium iodide ("TBAI"), tetrabutylammonium bromide ("TBABr"), tetrabutylammonium chloride ("TBACl") and tetrabutylammonium fluoride ("TBAF"). The ligand may include a metal chalcogenide ligand including $SnS_4^{4-}$, $Sn_2S_6^{4-}$, $SnTe_4^{4-}$, $AsS_3^{3-}$, $MoS_4^{2-}$, $Cu_7S_4^-$, $Sn_2Se_6^{4-}$, $In_2Se_4^{2-}$ or $Ge_2S_6^{4-}$; or a metal free inorganic ligand including $S^{2-}$, $HS^-$, $Se^{2-}$, $Te^{2-}$, $HTe^-$, $TeS_3^{2-}$, $OH^-$ or $NH^{2-}$. The semiconductor nanocrystal may have a size in a range of about 1 nanometer (nm) to about 50 nm.

Referring to FIG. 3, the type II junction provided by the first semiconductor layer 31 and the second semiconductor layer 32 refers to a junction state in which both the conduction band and the valence band of the first semiconductor layer 31 and the second semiconductor layer 32 form the same upward or downward steps, as shown in the right figure of FIG. 3. According to an exemplary embodiment, the energy difference between the conduction band and the valence band of the first semiconductor layer 31 and the second semiconductor layer 32 are both greater than or equal to about 0.1 eV. In such an embodiment, when the first semiconductor layer 31 and the second semiconductor layer 32 in the type II junction states receive light, holes and electrons are separated into the first semiconductor layer 31 and the second semiconductor layer 32, respectively, to provide the first semiconductor layer 31 and the second semiconductor layer 32 with conductivity, as shown in the left figure of FIG. 3. Accordingly, a voltage is applied between the first electrode 33 and the second electrode 34 to flow a current, and the quantity (e.g., amount or intensity) of light may be calculated by measuring the current.

The photoconductor has a fast reaction speed while providing a high photoelectric conversion rate (gain).

The photoelectric conversion rate of the photoconductor may be represented by Equation 1.

$$\text{Photoelectric conversion rate} = \text{mobility} \times \text{electric field} \times \text{recombine time} / \text{device length} \quad \text{Equation 1:}$$

Thus, the photoconductor may have a higher photoelectric conversion rate as the time of passing the carrier through the photoconductor is shorter than the time of recombining the excited electron/hole. Accordingly, the mobility may be increased or the time of recombining electron/hole pairs may be increased, to thereby increase the photoelectric conversion rate. According to an exemplary embodiment, the quantum dot films provide a type II junction in a direction perpendicular to the current, such that electrons/holes are spontaneously separated into an n-type layer and a p-type layer, respectively. In such an embodiment, as the electrons and holes are physically separated, the possibility of recombining electrons/holes is decreased to provide effects of increasing the recombining time. In such an embodiment, each thickness of the first semiconductor layer 31 and the second semiconductor layer 32 may be controlled to less than or equal to the diffusion lengths of electrons and holes, respectively to maximize the effects of increasing the recombining time. In such an embodiment, the first semiconductor layer 31 and the second semiconductor layer 32 may be repeatedly stacked a plurality of times to perform sufficient light absorption. The time of recombining the excited electrons/holes on the quantum dot film layer based on the type II junction may be prolonged by about 20 microseconds (μs), and the photoelectric conversion rate of the photoconductor may be thereby substantially increased. In an exemplary embodiment, where the time of recombining electrons/holes is about 20 μs, the reaction speed may be greater than or equal to about 10 kilohertz (kHz), such that the reaction speed may be improved by about 1000 times compared to the reaction speed of about 10 hertz (Hz) of the quantum dot film using a conventional electronic trap.

In such an embodiment, as described above, the first semiconductor layer 31 and the second semiconductor layer 32 may be repeatedly stacked a plurality of times to perform sufficient light absorption. Such a structure will now be described in detail with reference to FIGS. 4 and 5.

Figure 4:
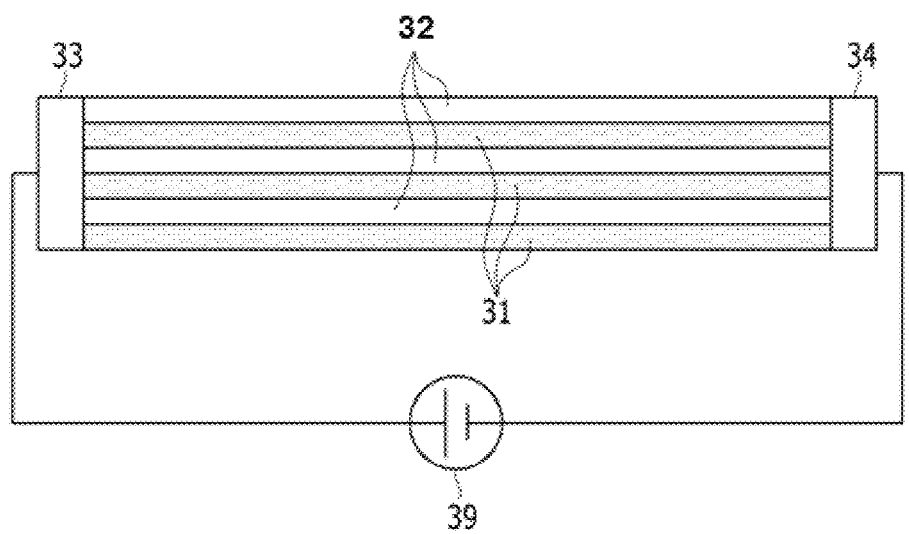
FIG. 4 is a cross-sectional view showing an alternative exemplary embodiment of a photoconductor.
Figure 5:
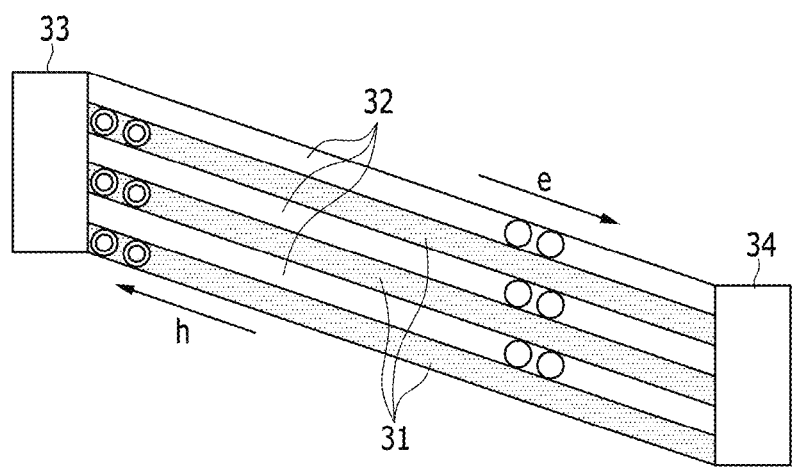
FIG. 5 is a schematic view showing an operation principle of the photoconductor shown in FIG. 4.

FIG. 4 is a cross-sectional view showing an alternative exemplary embodiment of a photoconductor, and FIG. 5 is a schematic view showing the operation principle of the photoconductor shown in FIG. 4.

Referring to FIG. 4, an exemplary embodiment of the photoconductor includes a semiconductor stacked structure in which a first semiconductor layer 31 and a second semiconductor layer 32 that provide a type II junction are repeatedly stacked three times, and a first electrode 33 and a second electrode 34 disposed at both opposing lateral sides (first and second lateral sides) of the first semiconductor layer 31 and the second semiconductor layer 32, respectively, and electrically connected to the first semiconductor layer 31 and the second semiconductor layer 32. In such an embodiment, three first semiconductor layers 31 and three second semiconductor layers 32 may be alternately stacked one on another. A DC power source 39 may be connected between the first electrode 33 and the second electrode 34, and the first semiconductor layer 31 and the second semiconductor layer 32 have conductivity to allow a current to flow therethrough when the first semiconductor layer 31 and the second semiconductor layer 32 receive light. The first semiconductor layer 31 and the second semiconductor layer 32 may defined a stacking structure, which may be formed by stacking a quantum dot material, and may include a pair of semiconductors being capable of forming a type II junction. The semiconductors may include at least one selected from Group IV, II-VI, III-V, III2-VI3, I-III-VI2, and I2-II-IV-VI4 semiconductors or a combination/mixture thereof. The Group IV, II-VI, III-V, III2-VI3, I-III-VI2, or I2-II-IV-VI4 semiconductor may include Si, Ge, CdS, CdSe, CdTe, PbS, PbSe, PbTe, HgS, HgSe, HgTe, ZnS, ZnSe, ZnTe, InP, InAs, InSb, GaP, GaAs, GaSb, $In_2S_3$, $In_2Se_3$, $In_2Te_3$, $Ga_2S_3$, $Ga_2Se_3$, $Ga_2Te_3$, $Bi_2S_3$, $Bi_2Se_3$, $Bi_2Te_3$, $CuInS_2$, $CuGaS_2$, $CuInSe_2$, $CuGaSe_2$, $Cu_2ZnSnS_4$, or $Cu_2ZnSnSe_4$. The quantum dot material may be formed by coating a surface of the nanocrystal consisting of such a semiconductor with a ligand. The ligand may include: a thiol-based ligand including BT, 1,2-BDT, 1,3-BDT, 1,4-BDT, EDT and MPA; an amine-based ligand including EDA or SCN; or a halide-based ligand including iodine, bromine, chlorine, or fluorine such as TBAI, TBABr, TBACl, and TBAF. The ligand may include a metal chalcogenide ligand including $SnS_4^{4-}$, $Sn_2S_6^{4-}$, $SnTe_4^{4-}$, $AsS_3^{3-}$, $MoS_4^{2-}$, $Cu_7S_4^-$, $Sn_2Se_6^{4-}$, $In_2Se_4^{2-}$, $Ge_2S_6^{4-}$; or a metal free inorganic ligand including $S^{2-}$, $HS^-$, $Se^{2-}$, $Te^{2-}$, $HTe^-$, $TeS_3^{2-}$, $OH^-$, and $NH^{2-}$. The semiconductor nanocrystal may have a size in a range of about 1 nm to about 50 nm.

In an exemplary embodiment, the first semiconductor layer 31 and the second semiconductor layer 32 are stacked three times as shown in FIG. 4, but not being limited thereto. In another alternative exemplary embodiment, the first semiconductor layer 31 and the second semiconductor layer 32 are stacked twice, or 4 times or more. In such an embodiment, the plurality of first semiconductor layers 31 may be formed with a same material as each other or different materials from each other. The plurality of second semiconductor layers 32 may be also formed with a same material as each other or different materials from each other. In such an embodiment, the kind of material, the size of quantum dots, and the kind of ligand coated on the quantum dots of the two semiconductor layers 31 and 32 may be determined to allow the adjacent two semiconductor layers 31 and 32 to provide a type II junction state, may be variously modified without limitation.

In such an embodiment, when the first semiconductor layer 31 and the second semiconductor layer 32 providing the type II junction state receive light, as shown in FIG. 5, holes and electrons are separated into the first semiconductor layer 31 and the second semiconductor layer 32, respectively, such that the first semiconductor layer 31 and the second semiconductor layer 32 may have conductivity. Accordingly, the voltage is applied between the first electrode 33 and the second electrode 34, a current is thereby generated therein, and the quantity of light may be confirmed by measuring the current.

In an exemplary embodiment, the photoconductor has a fast reaction speed with a high photoelectric conversion rate (gain).

Figure 6:
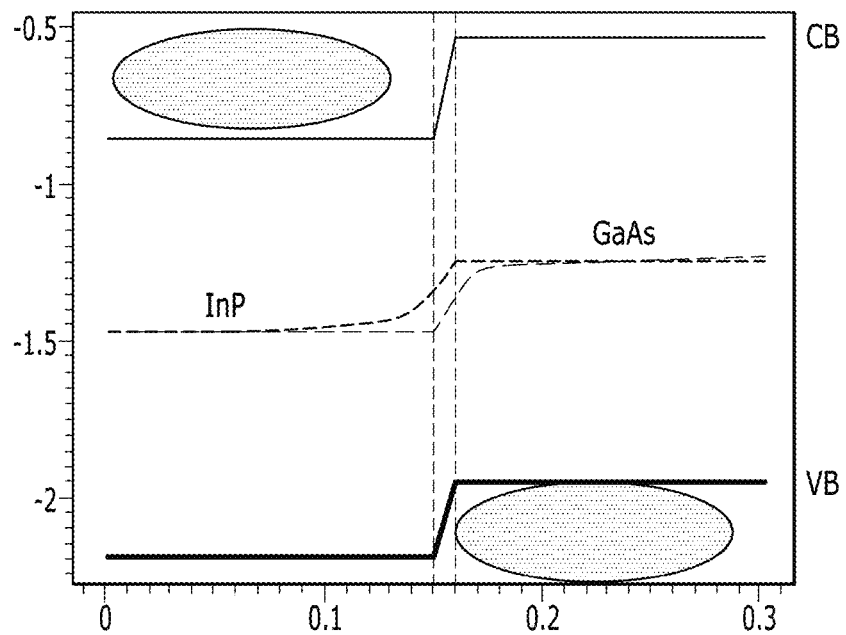
FIG. 6 is a graph showing an energy band of a cross-sectional surface when the photoconductor shown in FIG. 2 or FIG. 4 includes InP and GaAs.

FIG. 6 is a graph showing the energy band calculated using Synopsys TCAD when exemplary embodiments of the photoconductor shown in FIG. 2 or FIG. 4 are implemented with InP and GaAs (e.g., a photoconductor including a InP layer and a GaAs layer). The characteristics of InP and GaAs used in the calculation are shown in the following Table 1.

TABLE 1

| Materials | VB (eV) | $E_g$ (eV) | CB (eV) | Mobility (cm$^2$/Vs) | Effective mass $m_e$ | $m_h$ |
|---|---|---|---|---|---|---|
| GaAs | −5.49 | 1.41 | −4.07 | 9400 | 0.063 | 0.51/0.082 |
| InP | −5.72 | 1.34 | −4.38 | 5400 | 0.08 | 0.6/0.089 |

In Table 1 and FIG. 6, VB denotes valence band, CB denotes conduction band, and $E_g$ denotes band-gap energy, which is the difference between VB and CB. As shown in FIG. 6, when two semiconductor layers of photoconductors are formed with InP and GaAs, respectively, holes excited by the irradiation are transported to the GaAs layer having a higher valence band, and electrons are transported to the InP layer having a lower conduction band, so that the electrons and holes are physically separated to decrease the possibility of recombination of the electrons and holes. Accordingly, in such an embodiment, the high photoelectric conversion rate may be accomplished, and the reaction speed may be greater than or equal to about 10 kHz as the recombining time of electrons and holes may be about 20 μs.

Such an embodiment of the photoconductor shown in FIG. 2 or FIG. 4 may be effectively operated even when two semiconductor layers 31 and 32 form a quasi-type-II junction.

Figure 7:
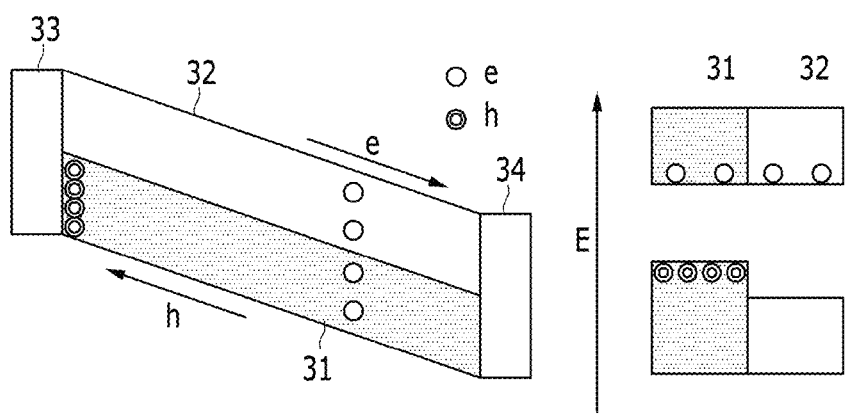
FIG. 7 is a schematic view showing an operation principle when the photoconductor shown in FIG. 2 provides a quasi-type-II junction.
Figure 8:
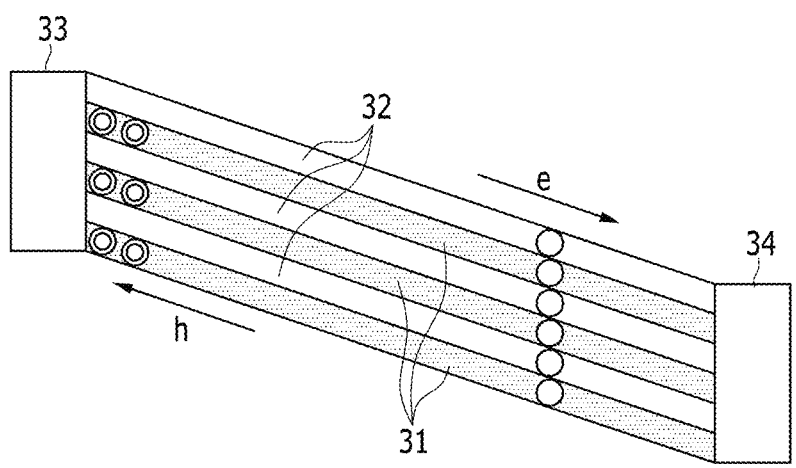
FIG. 8 is a schematic view showing an operation principle when the photoconductor shown in FIG. 4 provides a quasi-type-II junction.

FIG. 7 is a schematic view showing the operation principle when the photoconductor shown in FIG. 2 forms a quasi-type-II junction, and FIG. 8 is a schematic view showing the operation principle when the photoconductor shown in FIG. 4 forms a quasi-type-II junction.

The term "quasi-type-II junction" refers to the state that the conduction bands of the first semiconductor layer 31 and the second semiconductor layer 32 are similar to each other and have a difference of less than about 0.1 eV, and the valence bands thereof have a difference of greater than or equal to about 0.1 eV, as shown in the right figure of FIG. 7. In the quasi-type-II junction state, when the first semiconductor layer 31 and the second semiconductor layer 32 receive light to excite electrons and holes, holes are moved to the first semiconductor layer 31, but electrons are present in both the first semiconductor layer 31 and the second semiconductor layer 32, as shown in FIG. 7 and FIG. 8. Accordingly, the effects on physically separating the excited electrons and holes and reducing the recombination possibility may be decreased compared to the type II junction.

When the gate electrode is applied to the quasi-type-II junction structure, the brightness range of sensing of the image sensor may be enlarged by providing non-linearity to the photocurrent. Hereinafter, an exemplary embodiment of the photoconductor having the quasi-type-II junction structure will now be described.

Figure 9:
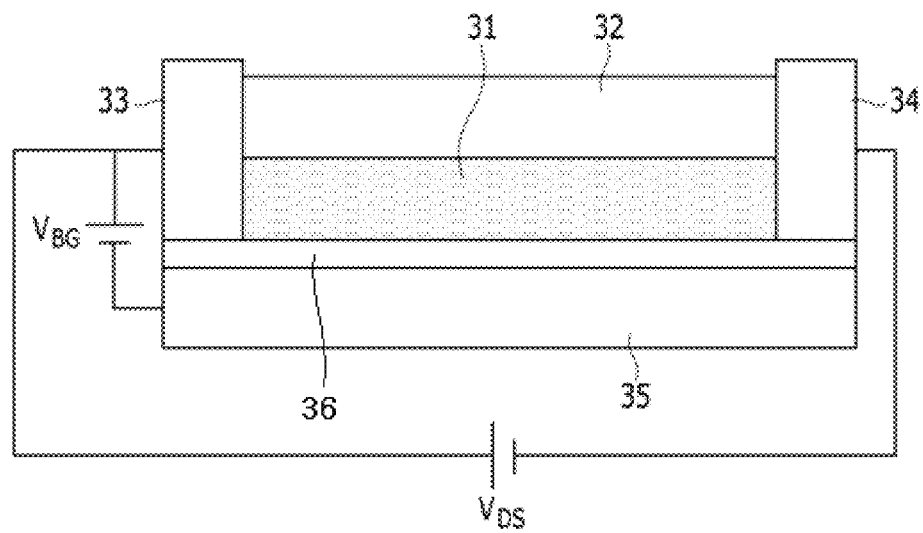
FIG. 9 is a cross-sectional view showing an alternative exemplary embodiment of a photoconductor.
Figure 10:
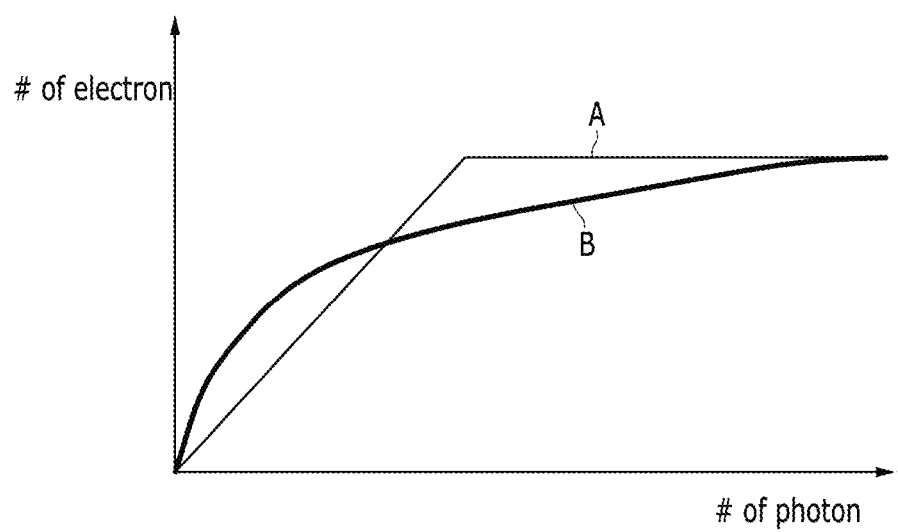
FIG. 10 is a graph showing a non-linear response accomplished through the photoconductor shown in FIG. 9.
Figure 11:
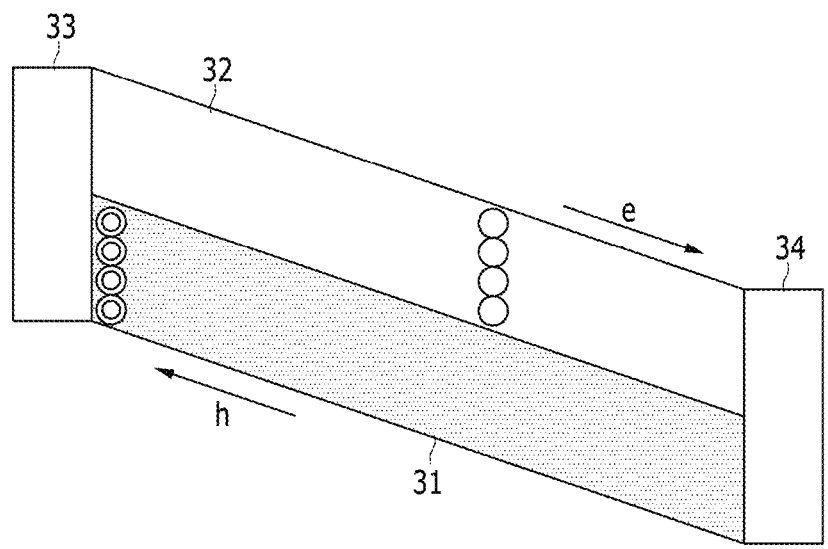
FIG. 11 is a schematic view showing the operation principle when a negative voltage is applied to a gate electrode in the exemplary embodiment shown in FIG. 9.
Figure 12:
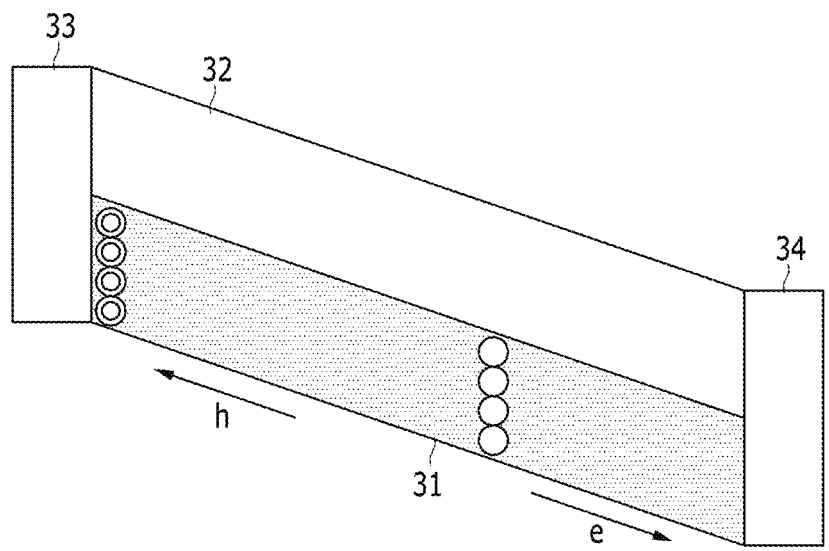
FIG. 12 is a schematic view showing the operation principle when a positive voltage is applied to a gate electrode in the exemplary embodiment shown in FIG. 9.

FIG. 9 is a cross-sectional view of an alternative exemplary embodiment of a photoconductor, FIG. 10 is a graph showing a non-linear response accomplished through a photoconductor shown in FIG. 9, FIG. 11 is a schematic view showing an operation principle when the negative voltage is applied to a gate electrode in the exemplary embodiment shown in FIG. 9, and FIG. 12 is a schematic view showing the operation principle when the positive voltage is applied to a gate electrode in the exemplary embodiment shown in FIG. 9.

Referring to FIG. 9, an alternative exemplary embodiment of the photoconductor includes a first semiconductor layer 31, a second semiconductor layer 32 disposed on the first semiconductor layer 31 and forming a quasi-type-II junction by contacting the first semiconductor layer 31, and a first electrode 33 and a second electrode 34 disposed to be connected to both opposing sides of the first semiconductor layer 31 and the second semiconductor layer 32, respectively, and electrically connected to the first semiconductor layer 31 and the second semiconductor layer 32. In such an embodiment, a gate electrode 35 is disposed under the first semiconductor layer 31 with an insulation layer 36 interposed between the first semiconductor layer 31 and the gate electrode 35. In an alternative exemplary embodiment, the gate electrode 35 and the insulation layer 36 may be disposed on the second semiconductor layer 32 instead of under the first semiconductor layer 31, or may be disposed both under the first semiconductor layer 31 and on the second semiconductor layer 32. A DC power source ($V_{DS}$) may be connected between the first electrode 33 and the second electrode 34, and a DC power source ($V_{BG}$) may be connected between the first electrode 33 and the gate electrode 35. When the first semiconductor layer 31 and the second semiconductor layer 32 receive light, the first semiconductor layer 31 and the second semiconductor layer 32 may have conductivity to allow a current to flow therein. The first semiconductor layer 31 and the second semiconductor layer 32 may include a stacking structure formed by stacking a quantum dot material, and include a pair of semiconductors being capable of forming a quasi-type-II junction. The semiconductors may include at least one selected from Group IV, II-VI, III-V, III2-VI3, I-III-VI2, and I2-II-IV-VI4 semiconductors or a combination/mixture thereof. The Group IV, II-VI, III-V, III2-VI3, I-III-VI2, or I2-II-IV-VI4 semiconductor may include Si, Ge, CdS, CdSe, CdTe, PbS, PbSe, PbTe, HgS, HgSe, HgTe, ZnS, ZnSe, ZnTe, InP, InAs, InSb, GaP, GaAs, GaSb, In$_2$S$_3$, In$_2$Se$_3$, In$_2$Te$_3$, Ga$_2$S$_3$, Ga$_2$Se$_3$, Ga$_2$Te$_3$, Bi$_2$S$_3$, Bi$_2$Se$_3$, Bi$_2$Te$_3$, CuInS$_2$, CuGaS$_2$, CuInSe$_2$, CuGaSe$_2$, Cu$_2$ZnSnS$_4$, or Cu$_2$ZnSnSe$_4$. The quantum dot material may be formed by coating a surface of a nanocrystal including such a semiconductor with a ligand. The ligand may include: a thiol-based ligand including BT, 1,2-BDT, 1,3-BDT, 1,4-BDT, EDT and MPA; an amine-based ligand including EDA or SCN; or a halide-based ligand including iodine, bromine, chlorine, or fluorine such as TBAI, TBABr, TBACl, and TBAF. The ligand may include a metal chalcogenide ligand including SnS$_4^{4-}$, Sn$_2$S$_6^{4-}$, SnTe$_4^{4-}$, AsS$_3^{3-}$, MoS$_4^{2-}$, Cu$_7$S$_4^-$, Sn$_2$Se$_6^{4-}$, In$_2$Se$_4{}^{2-}$ and Ge$_2$S$_6{}^{4-}$; or a metal free inorganic ligand including S$^{2-}$, HS$^-$, Se$^{2-}$, Te$^{2-}$, HTe$^-$, TeS$_3{}^{2-}$, OH$^-$ and NH$^{2-}$. The semiconductor nanocrystal may have a size in a range of about 1 nm to about 50 nm.

In such an embodiment, when a negative voltage (V$_{BG}$<0) is applied to the gate electrode 35, electrons of the first semiconductor layer 31 are pushed or moved by the gate voltage and are transported toward the second semiconductor layer 32 such that excited electrons and holes are physically separated from each other, as shown in FIG. 11. Accordingly, the current of the photoconductor is increased. In such an embodiment, when a positive voltage (V$_{BG}$>0) is applied to the gate electrode 35, electrons of the second semiconductor layer 32 are attracted by a gate voltage and moved to the first semiconductor layer 31, such that the physical separation of excited electrons and holes almost disappears, as shown in FIG. 12. Accordingly, the current of photoconductor is decreased. Based on such phenomenon, an exemplary embodiment of a photoconductor may have a non-linear response as shown in curve B of FIG. 10. In such an embodiment, a negative voltage is applied to the gate electrode 35 to enhance the photosensitivity of the photoconductor with the low quantity of light, and a positive voltage is applied to the gate electrode 35 to decrease the photosensitivity of the photoconductor with the high quantity of light, so that the non-linear response may be accomplished as in curve B of FIG. 10. The photoconductor having the non-linear response has a measurable quantity of light in a wider range than that of a photoconductor having the linear response as shown in curve A of FIG. 10. In the case of curve A of FIG. 10, at greater than or equal to the predetermined quantity of light, the number of excited electrons is substantially the same, so the measured current may be the same, thus it may not measure the quantity of light the same as above. However, in the case of curve B of FIG. 10, with the low quantity of light, the number of excited electrons is significantly increased even by a small increase in the quantity of light, while with the high quantity of light, the number of excited electrons is increased a small amount even by highly increasing the quantity of light. Accordingly, in such an embodiment, the measurable quantity of light by the photoconductor has a wide range, and the photoconductor may perform a sensing function with high sensitivity.

The voltage applied to the gate electrode 35 as shown in FIG. 9 may vary based on the quantity of light incident into the first semiconductor layer 31 and the second semiconductor layer 32, and the voltage applied to the gate electrode 35 may be in a range from about −40 V to about 40 V. In one exemplary embodiment, where photoconductor applied to a mobile device, the voltage applied to the gate electrode 35 may be in a range from about −5 V to about 5 V, for example.

Figure 13:
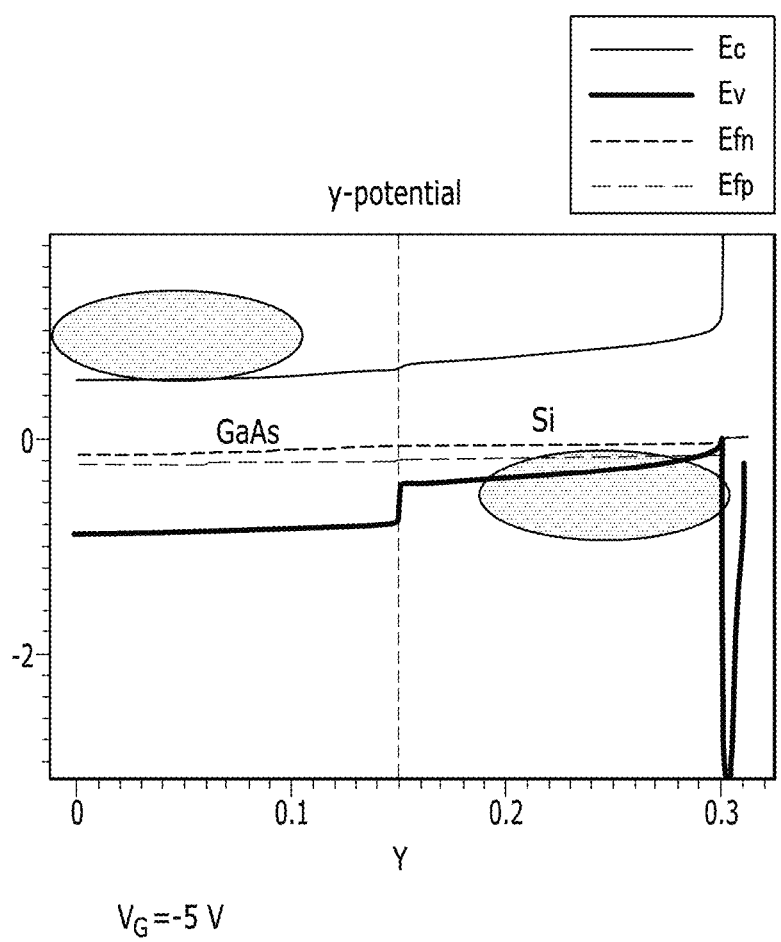
FIG. 13 is a graph showing an energy band when the photoconductor shown in FIG. 9 is implemented with GaAs and Si, and when a negative voltage (−5 V) is applied to a gate electrode.
Figure 14:
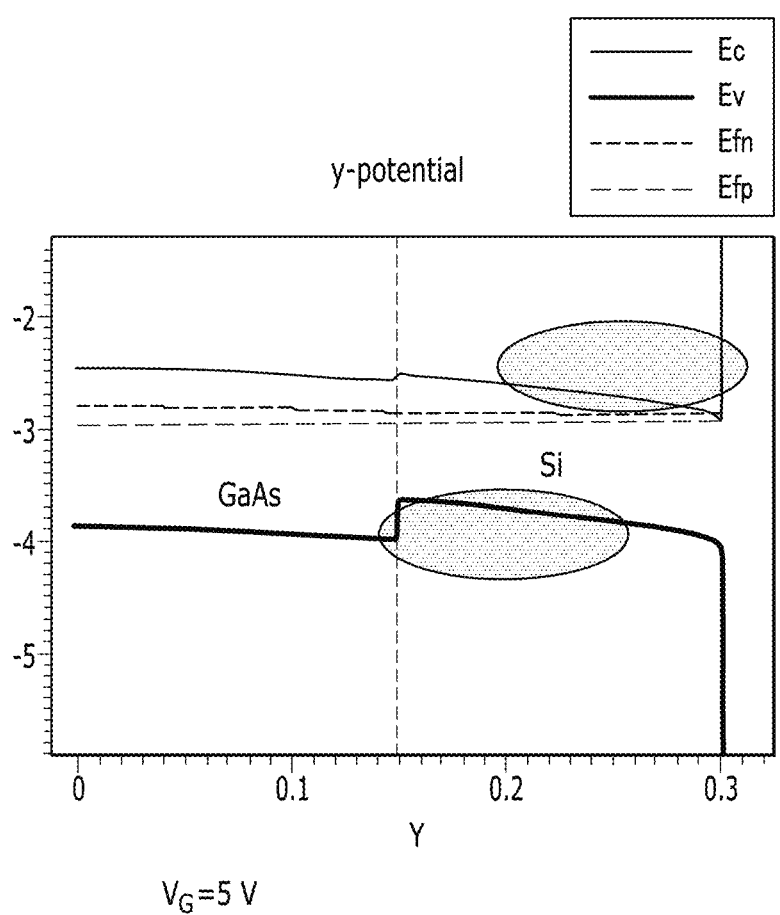
FIG. 14 is a graph showing an energy band when the photoconductor shown in FIG. 9 is implemented with GaAs and Si, and when a positive voltage (5 V) is applied to a gate electrode.

FIG. 13 is a graph showing the energy band calculated using Synopsys Technology Computer Aided Design ("TCAD") when an exemplary embodiment of the photoconductor shown in FIG. 9 is implemented with GaAs and Si, and when a negative voltage (about −5 V) is applied to the gate electrode, while FIG. 14 is a graph showing the energy band calculated when an exemplary embodiment of the photoconductor shown in FIG. 9 is implemented with GaAs and Si, and when a positive voltage (about 5 V) is applied to the gate electrode. GaAs and Si used in the calculation have the characteristics as in the following Table 2. In FIGS. 13 and 14, V$_G$ denotes a voltage applied to the gate electrode, Ec denotes conduction band, Ev denotes valence band, and Efn and Efp denote the Fermi energy levels in the n side and the p side of the junction, respectively.

TABLE 2

| Materials | VB (eV) | E$_g$ (eV) | CB (eV) | Mobility (cm$^2$/Vs) | Effective mass | |
|---|---|---|---|---|---|---|
| | | | | | m$_e$ | m$_h$ |
| GaAs | −5.49 | 1.41 | −4.07 | 9400 | 0.063 | 0.51/0.082 |
| Si | −5.17 | 1.12 | −4.05 | 700 | 0.19 | 0.49/0.16 |

As shown in FIG. 13, when two semiconductor layers of photoconductors are implemented with GaAs and Si, and when the negative voltage (−5 V) is applied to the gate electrode, holes excited by irradiation are transported into the Si layer having a high valence band, and electrons are transported into the GaAs layer having a decreased conduction band such that electrons and holes are physically separated from each other, and the possibility of recombining electrons and holes is thereby decreased. Accordingly, in an exemplary embodiment, the high photoelectric conversion rate may be accomplished, and the reaction speed may be greater than or equal to about 10 kHz as the time of recombining electrons and holes is about 20 μs. As shown in FIG. 14, when two semiconductor layers of photoconductors are formed with GaAs and Si, and when the positive voltage (about 5 V) is applied to the gate electrode, the electrons excited by the irradiation are transported to the Si layer, but holes may not be transported to GaAs due to the energy difference of the valence bands of GaAs and Si, thus holes are also stay in the Si layer, such that electrons and holes may not be physically separated from each other. Accordingly, the photoelectric conversion rate is decreased.

Figure 15:
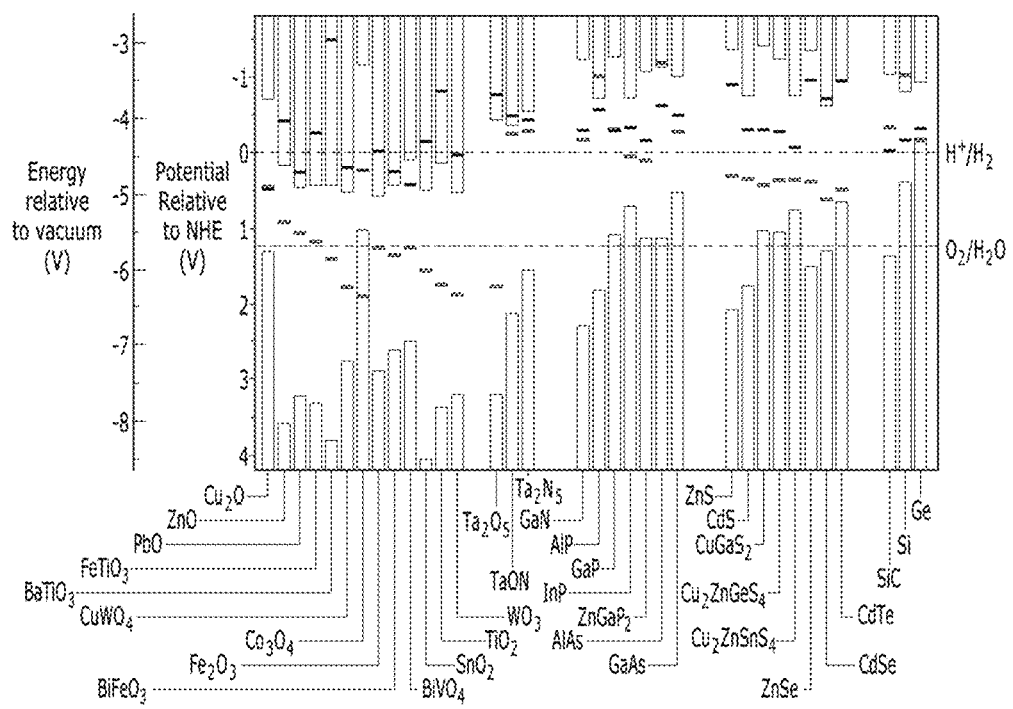
FIG. 15 is a graph showing energy bands of the various materials.

FIG. 15 is a graph shown in Chemistry of Materials vol. 24 (2012), Page 3662, which is shows the energy bands of the various materials.

In an exemplary embodiment, the materials of two semiconductor layers for photoconductors may be variously modified as long as the material forms a type II junction or a quasi-type-II junction. Referring to FIG. 15, for example, the type II junction may be formed using Cu$_2$O and ZnO, and the quasi-type-II junction may be formed using FeTiO$_3$ and BaTiO$_3$. Accordingly, the first semiconductor layer 31 and the second semiconductor layer 32 may include a pair of semiconductors being capable of forming a type II junction or a quasi-type-II junction. The semiconductors may include at least one selected from Group IV, II-VI, III-V, III2-VI3, I-III-VI2 and I2-II-IV-VI4 semiconductors, or a combination/mixture thereof. The Group IV, II-VI, III-V, III2-VI3, I-III-VI2, or I2-II-IV-VI4 semiconductor may include Si, Ge, CdS, CdSe, CdTe, PbS, PbSe, PbTe, HgS, HgSe, HgTe, ZnS, ZnSe, ZnTe, InP, InAs, InSb, GaP, GaAs, GaSb, In$_2$S$_3$, In$_2$Se$_3$, In$_2$Te$_3$, Ga$_2$S$_3$, Ga$_2$Se$_3$, Ga$_2$Te$_3$, Bi$_2$S$_3$, Bi$_2$Se$_3$, Bi$_2$Te$_3$, CuInS$_2$, CuGaS$_2$, CuInSe$_2$, CuGaSe$_2$, Cu$_2$ZnSnS$_4$, or Cu$_2$ZnSnSe$_4$.

Figure 16A:
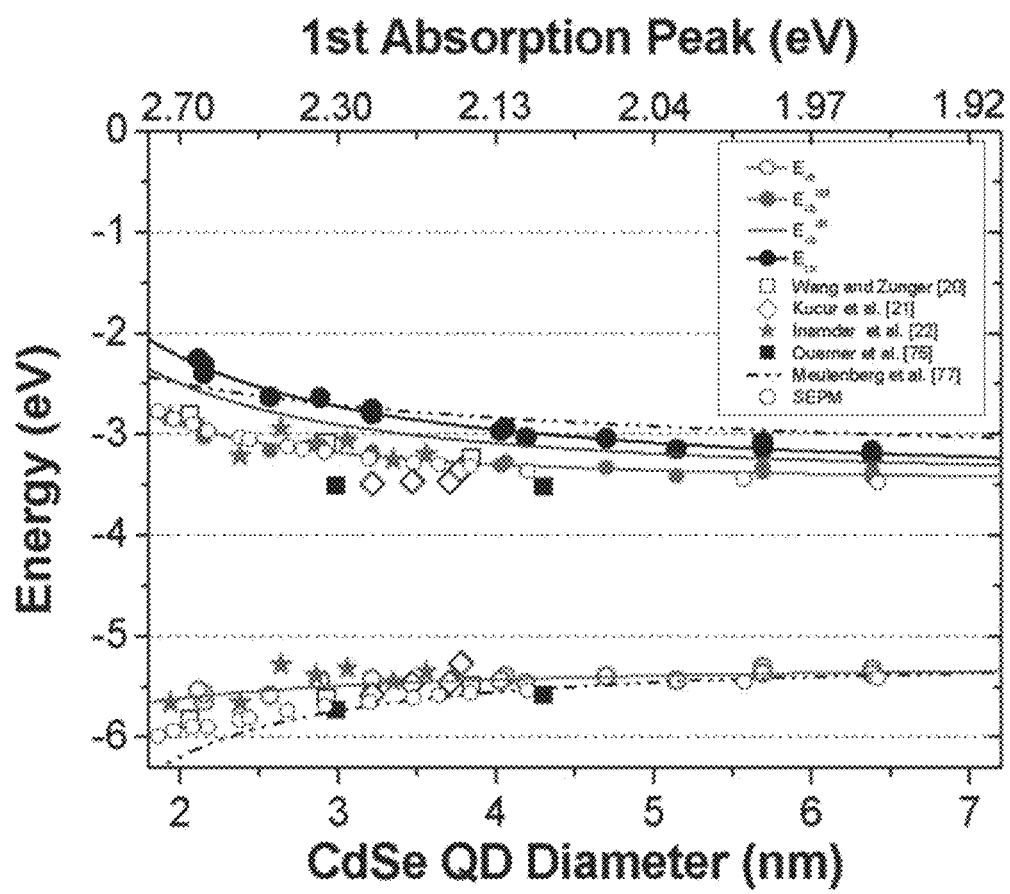
FIG. 16A is a graph showing the energy band change according to the size of quantum dots formed with CdSe.
Figure 16B:
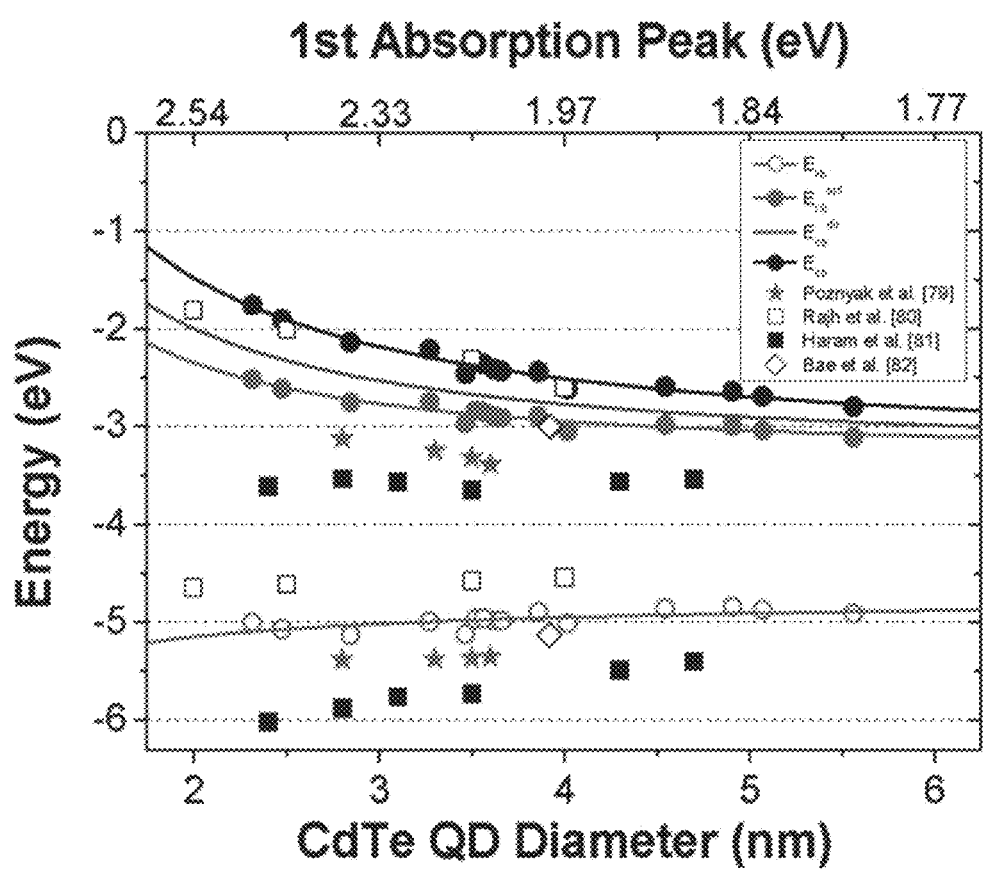
FIG. 16B is a graph showing the energy band change according to the size of quantum dots formed with CdTe.
Figure 16C:
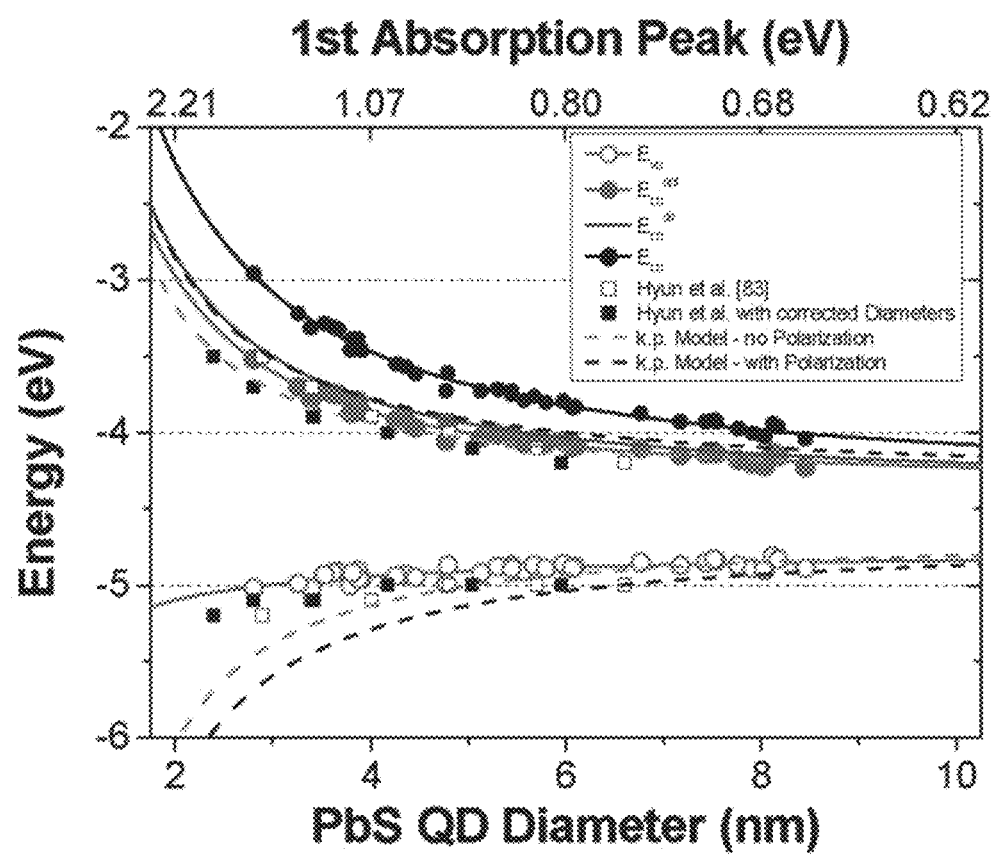
FIG. 16C is a graph showing the energy band change according to the size of quantum dots formed with PbS.
Figure 16D:
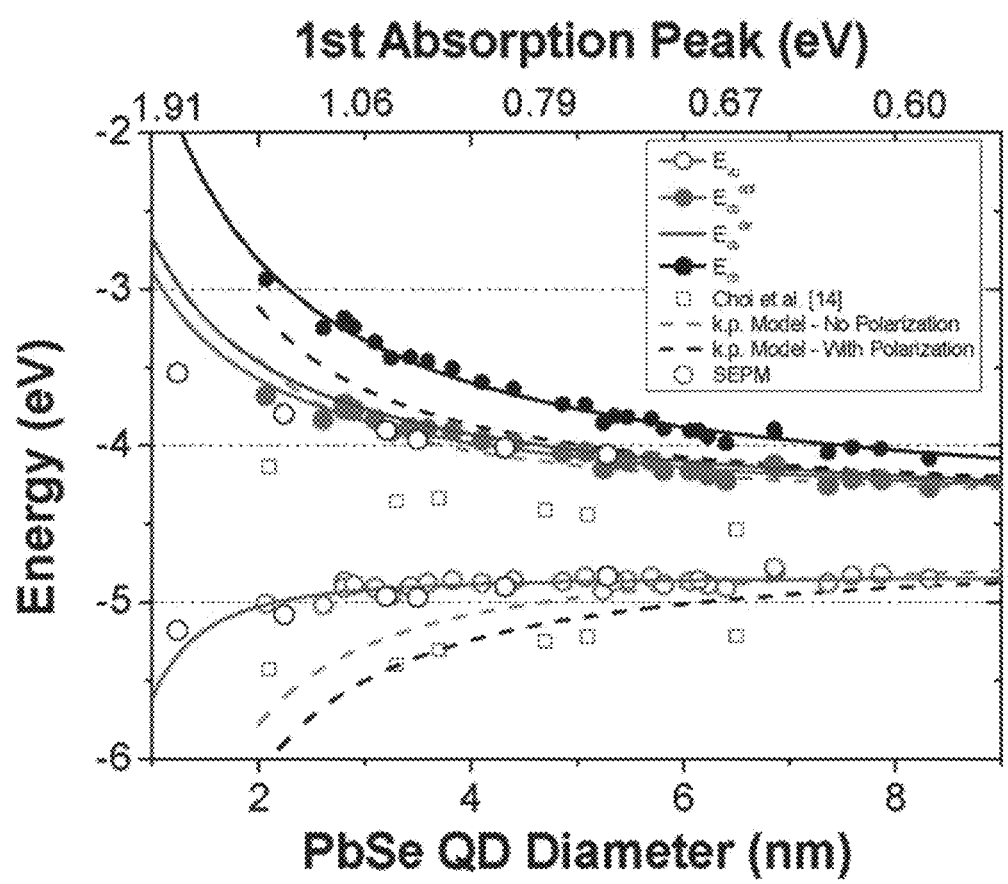
FIG. 16D is a graph showing the energy band change according to the size of quantum dots formed with PbSe.

FIG. 16A to FIG. 16D are graphs shown in page 5896 in ACS Nano vol. 5 (2011), wherein FIG. 16A is a graph showing the energy band change according to the size of quantum dots including CdSe, FIG. 16B is a graph showing the energy band change according to the size of quantum dots including CdTe, FIG. 16C is a graph showing the energy band change according to the size of quantum dots including PbS, and FIG. 16D is a graph showing the energy band change according to the size of quantum dots including PbSe.

Referring to FIG. 16A to FIG. 16D, the energy of the conduction band and the valence band of a same material are each changes depending upon the size of nanocrystal thereof. Accordingly, it is also possible to provide a predetermined type II junction or quasi-type-II junction by adjusting the nanocrystal size of the materials. The first semiconductor layer 31 and the second semiconductor layer 32 may provide a semiconductor nanocrystal having a size in a range of about 1 nm to about 50 nm.

Figure 17:
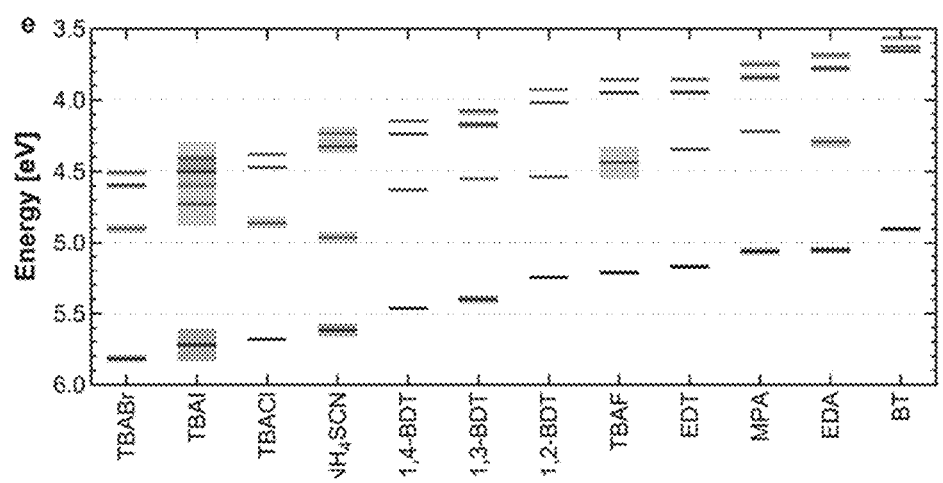
FIG. 17 is a graph showing the energy band of the various ligands coated on the surface of the quantum dots.

FIG. 17 is a graph published on page 5864 in ACS Nano vol. 8 (2014), and shows energy bands of the various ligands coated on the surface of quantum dots.

Referring to FIG. 17, it is understood that the conduction band and the valence band of a quantum dot may also be changed according to the kind of ligand coated on the surface of the semiconductor nanocrystal thereof. Accordingly, the quantum dots of the first semiconductor layer 31 and the second semiconductor layer 32 may be formed by coating the surface of a semiconductor nanocrystal with a ligand such as a thiol-based ligand including BT, 1,2-BDT, 1,3-BDT, 1,4-BDT, EDT and MPA; an amine-based ligand including EDA or SCN; and a halide-based ligand including iodine, bromine, chlorine, or fluorine such as TBAI, TBABr, TBACl and TBAF; a metal chalcogenide ligand including $SnS_4^{4-}$, $Sn_2S_6^{4-}$, $SnTe_4^{4-}$, $AsS_3^{3-}$, $MoS_4^{2-}$, $Cu_7S_4^-$, $Sn_2Se_6^{4-}$, $In_2Se_4^{2-}$, $Ge_2S_6^{4-}$; and a metal free inorganic ligand including $S^{2-}$, $HS^-$, $Se^{2-}$, $Te^{2-}$, $HTe^-$, $TeS_3^{2-}$, $OH^-$, and $NH^{2-}$.

While this disclosure has been described in connection with what is presently considered to be practical exemplary embodiments, it is to be understood that this disclosure is not limited to the disclosed embodiments, but, on the contrary, is intended to cover various modifications and equivalent arrangements included within the spirit and scope of the appended claims.

What is claimed is:

1. A photoconductor comprising:
   a first semiconductor layer;
   a second semiconductor layer disposed on the first semiconductor layer;
   a first electrode connected to a first lateral side of the first semiconductor layer and the second semiconductor layer; and
   a second electrode connected to a second lateral side of the first semiconductor layer and the second semiconductor layer,
   wherein the first semiconductor layer and the second semiconductor layer form a type II junction or a quasi-type-II junction,
   wherein each of the first semiconductor layer and the second semiconductor layer comprises a quantum dot material, and
   the quantum dot material comprises a nanocrystal and a ligand coated on a surface of the nanocrystal.

2. The photoconductor of claim 1, wherein
   an energy difference between a conduction band of the first semiconductor layer and a conduction band of the second semiconductor layer is greater than or equal to about 0.1 eV, and
   an energy difference between a valence band of the first semiconductor layer and a valence band of the second semiconductor layer is greater than or equal to about 0.1 eV.

3. The photoconductor of claim 1, wherein each of the first semiconductor layer and the second semiconductor layer has a thickness in a range of about 5 nm to about 500 nm.

4. The photoconductor of claim 2, wherein
   the nanocrystal comprises at least one selected from Group IV, II-VI, III-V, III2-VI3, I-III-VI2, and I2-II-IV-VI4 semiconductors.

5. The photoconductor of claim 4, wherein
   the ligand comprises at least one selected from a thiol-based ligand, an amine-based ligand, a halide-based ligand, a metal chalcogenide ligand, and a metal free inorganic ligand.

6. The photoconductor of claim 4, wherein the nanocrystal has a size in a range of about 1 nm to about 50 nm.

7. The photoconductor of claim 1, further comprising:
   a third electrode disposed under the first semiconductor layer or on the second semiconductor layer.

8. The photoconductor of claim 7, wherein the first semiconductor layer and the second semiconductor layer form a quasi-type-II junction.

9. The photoconductor of claim 8, wherein
   the energy difference between a conduction band of the first semiconductor layer and a conduction band of the second semiconductor layer is less than about 0.1 eV, and
   the energy difference between a valence band of the first semiconductor layer and a valence band of the second semiconductor layer is greater than or equal to about 0.1 eV.

10. The photoconductor of claim 9, wherein a voltage applied to the third electrode changes based on quantity of light incident into the first semiconductor layer and the second semiconductor layer.

11. The photoconductor of claim 10, wherein the voltage applied to the third electrode is in a range from about −40 V to about 40 V.

12. The photoconductor of claim 11, wherein the voltage applied to the third electrode is in a range from about −5 V to about 5 V.

13. The photoconductor of claim 1, further comprising:
    a third semiconductor layer disposed on the second semiconductor layer, and
    a fourth semiconductor layer disposed on the third semiconductor layer,
    wherein the first electrode is further connected to a first lateral side of the third semiconductor layer and the fourth semiconductor layer, and
    the second electrode is further connected to a second lateral side of the third semiconductor layer and the fourth semiconductor layer.

14. The photoconductor of claim 13, wherein the third semiconductor layer and the fourth semiconductor layer form a type II junction or a quasi-type-II junction.

15. The photoconductor of claim 14, wherein
    each of the first semiconductor layer, the second semiconductor layer, the third semiconductor layer and the fourth semiconductor layer comprises a quantum dot material, and
    the quantum dot material comprises a nanocrystal comprising at least one selected from Group IV, II-VI, III-V, III2-VI3, I-III-VI2, and I2-II-IV-VI4 semiconductors.

16. The photoconductor of claim 15, wherein
    the quantum dot material further comprises a ligand coated on the surface of the nanocrystal;
    the ligand comprises at least one selected from a thiol-based ligand, an amine-based ligand, a halide-based ligand, a metal chalcogenide ligand, and a metal free inorganic ligand.

17. The photoconductor of claim 16, wherein the nanocrystal has a size in a range of about 1 nm to about 50 nm.

18. An image sensor comprising the photoconductor of claim 1.

19. The image sensor of claim 18, wherein the photoconductor further comprises:

a third electrode disposed under the first semiconductor layer or on the second semiconductor layer.

20. The image sensor of claim 19, wherein the first semiconductor layer and the second semiconductor layer of the photoconductor form a quasi-type-II junction.

21. The image sensor of claim 20, wherein the third electrode is applied with a voltage corresponding to a quantity of light incident to the first semiconductor layer and the second semiconductor layer of the photoconductor.

* * * * *